US010126469B2

(12) United States Patent
Yu et al.

(10) Patent No.: US 10,126,469 B2
(45) Date of Patent: *Nov. 13, 2018

(54) NANOSTRUCTURED MATERIAL AND METHOD OF MAKING THE SAME

(71) Applicant: 3M INNOVATIVE PROPERTIES COMPANY, St. Paul, MN (US)

(72) Inventors: Ta-Hua Yu, Woodbury, MN (US); Moses M. David, Woodbury, MN (US); Abdujabar K. Dire, Woodbury, MN (US); Albert I. Everaerts, St. Paul, MN (US); William Blake Kolb, Stillwater, MN (US); Todd M. Sandman, Cumberland, WI (US); Shunsuke Suzuki, Tokyo (JP); Scott A. Walker, White Bear Lake, MN (US)

(73) Assignee: 3M INNOVATIVE PROPERTIES COMPANY, Saint Paul, MN (US)

( * ) Notice: Subject to any disclaimer, the term of this patent is extended or adjusted under 35 U.S.C. 154(b) by 20 days.

This patent is subject to a terminal disclaimer.

(21) Appl. No.: 15/485,914

(22) Filed: Apr. 12, 2017

(65) Prior Publication Data

US 2017/0221680 A1 Aug. 3, 2017

Related U.S. Application Data

(62) Division of application No. 14/387,338, filed as application No. PCT/US2013/027348 on Feb. 22, 2013, now Pat. No. 9,651,715.

(60) Provisional application No. 61/615,646, filed on Mar. 26, 2012.

(51) Int. Cl.
| | |
|---|---|
| *H01J 37/32* | (2006.01) |
| *G02B 1/12* | (2006.01) |
| *G02B 1/111* | (2015.01) |
| *G02B 1/118* | (2015.01) |
| *G02B 1/04* | (2006.01) |
| *G02B 1/16* | (2015.01) |
| *B82Y 20/00* | (2011.01) |

(52) U.S. Cl.
CPC ............ *G02B 1/12* (2013.01); *B82Y 20/00* (2013.01); *G02B 1/04* (2013.01); *G02B 1/111* (2013.01); *G02B 1/118* (2013.01); *G02B 1/16* (2015.01); *H01J 37/32009* (2013.01); *G02B 2207/101* (2013.01); *H01J 2237/334* (2013.01); *H01J 2237/3345* (2013.01); *Y10S 977/781* (2013.01)

(58) Field of Classification Search
CPC .......... G02B 1/118; G02B 1/12; G02B 1/111; G02B 2207/101; G02B 1/04; G02B 20/00; G02B 1/16; B82Y 20/00; H01J 37/32009; H01J 2237/334; H01J 2237/3345; Y10S 977/781

USPC .......... 359/599–601, 609, 613–614
See application file for complete search history.

(56) References Cited

U.S. PATENT DOCUMENTS

| | | | |
|---|---|---|---|
| 4,374,158 A | 2/1983 | Taniguchi | |
| 5,825,543 A | 10/1998 | Ouderkirk | |
| 5,867,316 A | 2/1999 | Carlson | |
| 5,882,774 A | 3/1999 | Jonza | |
| 5,888,594 A | 3/1999 | David | |
| 6,352,761 B1 | 3/2002 | Hebrink | |
| 6,368,699 B1 | 4/2002 | Gilbert | |
| 6,592,950 B1 | 7/2003 | Toshima | |
| 6,645,843 B2 | 11/2003 | Kim | |
| 6,927,900 B2 | 8/2005 | Liu | |
| 7,336,421 B2 | 2/2008 | Tanaka | |
| 7,378,136 B2 | 5/2008 | Pokorny | |
| 7,604,381 B2 | 10/2009 | Hebrink | |
| 7,892,606 B2 | 2/2011 | Thies | |
| 8,361,339 B2 | 1/2013 | Nakanishi | |
| 8,840,258 B2 | 9/2014 | Nakanishi | |
| 9,400,343 B1 | 7/2016 | Pethuraja | |
| 2001/0013668 A1 | 8/2001 | Neavin | |
| 2005/0233083 A1 | 10/2005 | Schulz | |
| 2006/0074172 A1 | 4/2006 | Yang | |
| 2006/0084780 A1 | 4/2006 | Hebrink | |
| 2009/0059368 A1* | 3/2009 | Kamada | B32B 17/10 359/489.01 |
| 2009/0087629 A1 | 4/2009 | Everaerts | |
| 2009/0201583 A1 | 8/2009 | Kamada | |
| 2009/0229732 A1 | 9/2009 | Determan | |
| 2009/0231714 A1 | 9/2009 | Zhao | |
| 2010/0028564 A1 | 2/2010 | Cheng | |

(Continued)

FOREIGN PATENT DOCUMENTS

| | | |
|---|---|---|
| EP | 1022587 | 7/2000 |
| JP | 2009-034630 | 2/2009 |

(Continued)

OTHER PUBLICATIONS

Gilbert, "Comparison of ITO Sputtering Process from Ceramic and Alloy Targets onto Room Temperature PET Substrates", Society of Vacuum Coaters, 36th Annual Technical Conference Proceedings, 1993, pp. 236-241.

(Continued)

*Primary Examiner* — Zachary Wilkes
*Assistant Examiner* — George G King
(74) *Attorney, Agent, or Firm* — Gregory D. Allen

(57) ABSTRACT

Nanostructured material exhibiting a random anisotropic nanostructured surface, and exhibiting an average reflection at 60 degrees off angle less than 1 percent. The nanostructured materials are useful, for example, for optical and optoelectronic devices, displays, solar, light sensors, eye wear, camera lens, and glazing.

10 Claims, No Drawings

(56) References Cited

U.S. PATENT DOCUMENTS

| | | |
|---|---|---|
| 2010/0040842 A1 | 2/2010 | Everaerts |
| 2010/0165276 A1 | 7/2010 | David |
| 2010/0195204 A1 | 8/2010 | Walker |
| 2010/0294989 A1 | 11/2010 | Shaffer, II |
| 2015/0077854 A1 | 3/2015 | Yu |

FOREIGN PATENT DOCUMENTS

| | | |
|---|---|---|
| JP | 2009-128538 | 6/2009 |
| WO | WO 1995/17303 | 6/1995 |
| WO | WO 1995/17691 | 6/1995 |
| WO | WO 1995/17692 | 6/1995 |
| WO | WO 1995/17699 | 6/1995 |
| WO | WO 1996/19347 | 6/1996 |
| WO | WO 1997/01440 | 1/1997 |
| WO | WO 1999/36248 | 7/1999 |
| WO | WO 1999/36262 | 7/1999 |
| WO | WO 2008/128073 | 10/2008 |
| WO | WO 2009/114683 | 9/2009 |
| WO | WO 2010/078071 | 7/2010 |
| WO | WO 2010/078306 | 7/2010 |
| WO | WO 2010/078346 | 7/2010 |
| WO | WO 2010/123528 | 10/2010 |
| WO | WO 2011/109284 | 9/2011 |
| WO | WO 2011/109287 | 9/2011 |
| WO | WO 2012/106417 | 8/2012 |
| WO | WO 2012/125247 | 9/2012 |
| WO | WO 2012/125324 | 9/2012 |
| WO | WO 2013/025614 | 2/2013 |
| WO | WO 2013/148129 | 10/2013 |

OTHER PUBLICATIONS

Ma, "Preparation and properties of indium tin oxide films deposited on polyester substrates by reactive evaporation", Thin Solid Films, 1997, vol. 307, pp. 200-202.

Minami, "Physics of very thin ITO conducting films with high transparency prepared by DC magnetron sputtering", Thin Solid Film, 1995, vol. 270, pp. 37-42.

Skotheim, Handbook of Conducting Polymers, Second Edition, Marcel Dekker, Inc., pp. 7-12 (1998).

International Search Report for PCT International Application No. PCT/US2013/027348, dated Apr. 17, 2013, 4 pages.

* cited by examiner

NANOSTRUCTURED MATERIAL AND METHOD OF MAKING THE SAME

CROSS REFERENCE TO RELATED APPLICATIONS

This application is a divisional application of pending prior application Ser. No. 14/387,338, filed Sep. 23, 2014, which is a National Stage Entry of PCT/US2013/027348, filed Feb. 22, 2013, which claims priority from U.S. Provisional Application 61/615,646, filed Mar. 26, 2012, the disclosures of which are incorporated by reference in their entireties herein.

BACKGROUND

When light travels from one medium to another, some portion of the light is reflected from the interface between the two media. For example, typically about 4-5% of the light shining on a clear plastic substrate is reflected at the top surface.

The back lighting for mobile hand held and laptop devices are not effective to provide desired display quality in the presence of the reflection of the external lighting from the top surface and internal interfaces of the display devices, which in turn reduces contrast ratio and can downgrade viewing quality from the interfering image of external objects.

Different approaches have been employed to reduce the reflection of the top surface of display devices. One approach is to use antireflective coatings such as multilayer reflective coatings consisting of transparent thin film structures with alternating layers of contrasting refractive index to reduce reflection. However, it can be difficult to achieve broadband antireflection using the multilayer antireflective coating technology.

Another approach involves using subwavelength surface structure (e.g., subwavelength scale surface gratings) for broadband antireflection, where the phrase subwavelength is used to describe an object or structure having one or more dimensions smaller than the length of the wave with which the object or structure interacts. For suppression of Fresnel reflections from optical surfaces, subwavelength structured features lead to continuous-profile surface-relief grating as an effective medium to minimize reflection for a range of wavelengths greater than the subwavelength structured features on the surface. Methods for creating the subwavelength surface structure (e.g., by lithography) tend to be relatively complicated and expensive.

Reduction of reflection at broad angle is desired in applications related to optical and optoelectronic devices. It is difficult to fabricate deep surface structure providing low reflection (<1.5%) at 60 degree off angle (i.e., 60 degree from normal to the surface) with traditional subwavelength structure surface technology (e.g., by lithography). Micrometer-scale microstructures such as prism has been intensively utilized to reduce reflection at broad angle for solar applications, but this approach tends to result in high haze and is only applicable when light is transporting from low refractive index medium to high refractive index medium.

SUMMARY

In one aspect, the present disclosure describes a nanostructured material exhibiting a random anisotropic nanostructured surface, and exhibiting an average reflection at 60 degrees off angle less than 1 percent (in some embodiments, less than 0.75, 0.5, 0.25, or less than 0.2 percent). Typically, the nanostructured material comprises a polymeric matrix and a nanoscale dispersed phase.

In another aspect, the present disclosure describes a method of making nanostructured materials described herein, the method comprising:
    providing a polymeric matrix comprising a nanodispersed phase; and
    anisotropically etching the polymeric matrix using plasma to form a random anisotropic nanostructured surface.

In another aspect, the present disclosure describes a method of making nanostructured materials described herein, the method comprising:
    providing a polymeric matrix comprising a nanodispersed phase; and
    etching at least a portion of the polymeric matrix using plasma to form a random anisotropic nanostructured surface.

Optionally, articles described herein further comprise a functional layer (i.e., at least one of a transparent conductive layer or a gas barrier layer) disposed between the first major surface of a substrate and a layer of material described herein. Optionally, articles described herein further comprise a functional layer (i.e., at least one of a transparent conductive layer or a gas barrier layer) disposed on a layer of material described herein.

Optionally, articles described herein further comprise a (second) layer of material (including those described herein and those described in PCT Appl. Nos. US2011/026454, filed Feb. 28, 2011, and U.S. Pat. Appl. Nos. 61/452,403 and 61/452,430, filed Mar. 14, 2011, the disclosures of which are incorporated herein by reference) on the second major surface of a substrate. Optionally, articles described herein further comprise a functional layer (i.e., at least one of a transparent conductive layer or a gas barrier layer) disposed between the second major surface of a substrate and a (second) layer of material. Optionally, articles described herein further comprise a functional layer (i.e., at least one of a transparent conductive layer or a gas barrier layer) disposed on a (second) layer of material.

Articles described herein can be used, for example, for creating high performance, low fringing, antireflective optical articles. When a functional layer (i.e., at least one of a transparent conductive layer or a gas barrier layer) is disposed on a layer of material described herein, articles described herein may have significantly enhanced optical performance.

Embodiments of nanostructured materials and articles described herein are useful for numerous applications including optical and optoelectronic devices, displays, solar cells, light sensors, eye wear, camera lenses, and glazing.

DETAILED DESCRIPTION

Typically, the nanostructured material comprises a polymeric matrix and a nanoscale dispersed phase. In some embodiments, the polymeric matrix comprises at least one of acrylate, urethane acrylate, methacrylate, polyester, epoxy, fluoropolymer, or siloxane.

The polymeric matrix can be made from reactive precursors. Examples of precursors include polymerizable resins comprising at least one oligomeric urethane (meth)acrylate. Typically the oligomeric urethane (meth)acrylate is multi (meth)acrylate. The term "(meth)acrylate" is used to designate esters of acrylic and methacrylic acids, and "multi (meth)acrylate" designates a molecule containing more than one (meth)acrylate group, as opposed to "poly(meth)acrylate" which commonly designates (meth)acrylate polymers.

Typically, the multi(meth)acrylate is a di(meth)acrylate, although other examples include tri(meth)acrylates and tetra (meth)acrylates.

Oligomeric urethane multi(meth)acrylates are available, for example, from Sartomer under the trade designation "PHOTOMER 6000 Series" (e.g., "PHOTOMER 6010" and "PHOTOMER 6020"), under the trade designation "CN 900 Series" (e.g., "CN966B85", "CN964", and "CN972"). Oligomeric urethane (meth)acrylates are also available, for example, from Surface Specialties under the trade designations "EBECRYL 8402", "EBECRYL 8807", and "EBECRYL 4827". Oligomeric urethane (meth)acrylates may also be prepared, for example, by the initial reaction of an alkylene or aromatic diisocyanate of the formula OCN—R3-NCO, wherein R3 is a C2-100 alkylene or an arylene group with a polyol. Typically, the polyol is a diol of the formula HO—R4-OH, wherein R4 is a C2-100 alkylene group. Dependant on the stoichiometry of the reagents the intermediate product is then a urethane diol or diisocyanate, which subsequently can undergo reaction with an isocyanate functional vinyl monomer, such as 2-isocyanatoethyl(meth) acrylate, respectively a 2-hydroxyalkyl (meth)acrylate. Suitable diisocyanates include 2,2,4-trimethylhexylene diisocyanate and toluene diisocyanates. Alkylene diisocyanates are generally preferred. In one case, compound of this type may be prepared from 2,2,4-trimethylhexylene diisocyanate, poly(caprolactone)diol, and 2-hydroxyethyl methacrylate. In at least some cases, the urethane (meth)acrylate is preferably aliphatic.

The polymerizable precursors can be radiation curable compositions comprising at least one other monomer (i.e., other than an oligomeric urethane (meth)acrylate). The other monomer may reduce viscosity and/or improve thermomechanical properties and/or increase refractive index. Monomers having these properties include acrylic monomers (i.e., acrylate and methacrylate esters, acrylamides, and methacrylamides), styrene monomers, and ethylenically unsaturated nitrogen heterocycles. Examples of UV curable acrylate monomers from Sartomer include "SR238", "SR351", "SR399", and "SR444".

Suitable acrylic monomers include monomeric (meth) acrylate esters. They include alkyl (meth)acrylates (e.g., methyl acrylate, ethyl acrylate, 1-propyl acrylate, methyl methacrylate, 2-ethylhexylacrylate, isobornyl(meth)acrylate, lauryl acrylate, tetrahydrofurfuryl acrylate, isooctyl acrylate, ethoxyethoxyethyl acrylate, methoxyethoxyethyl acrylate, and t-butyl acrylate). Also included are (meth) acrylate esters having other functionality. Compounds of this type are illustrated by ethoxyethoxyethyl acrylate, methoxyethoxyethyl acrylate, tetrahydrofurfuryl acrylate, 2-(N-butylcarbamyl)ethyl (meth)acrylate, 2,4-dichlorophenyl acrylate, 2,4,6-tribromophenyl acrylate, tribromophenoxyethyl acrylate, t-butylphenyl acrylate, phenyl acrylate, phenyl thioacrylate, phenylthioethyl acrylate, alkoxylated phenyl acrylate, isobornyl acrylate, and phenoxyethyl acrylate. The reaction product of tetrabromobisphenol A diepoxide, and (meth)acrylic acid is also suitable.

The other monomer may also be a monomeric N-substituted or N,N-disubstituted (meth)acrylamide, especially an acrylamide. These include N-alkylacrylamides and N,N-dialkylacrylamides, especially those containing C1-4 alkyl groups. Examples are N-isopropylacrylamide, N-t-butylacrylamide, N,N-dimethylacrylamide, and N,N-diethylacrylamide.

The other monomer may further be a polyol multi(meth) acrylate. Such compounds are typically prepared from aliphatic diols, triols, and/or tetraols containing 2-10 carbon atoms. Examples of suitable poly(meth)acrylates are ethylene glycol diacrylate, 1,6-hexanediol diacrylate, 2-ethyl-2-hydroxymethyl-1,3-propanediol triacylate (trimethylolpropane triacrylate), di(trimethylolpropane) tetraacrylate, pentaerythritol tetraacrylate, the corresponding methacrylates, and the (meth)acrylates of alkoxylated (usually ethoxylated) derivatives of said polyols. Monomers having at least two (ethylenically unsaturated groups can serve as a crosslinker.

Styrenic compounds suitable for use as the other monomer include styrene, dichlorostyrene, 2,4,6-trichlorostyrene, 2,4,6-tribromostyrene, 4-methylstyrene, and 4-phenoxystyrene. Ethylenically unsaturated nitrogen heterocycles include N-vinylpyrrolidone and vinylpyridine.

Additional examples of polymerizable precursors include tetrafluoroethylene, vinylfluoride, vinylidene fluoride, chlorotrifluoroethylene, perfluoroakoxy, fluorinated ethylenepropylene, ethylenetetrafluoroethylene, ethylenechlorotrifluoroethylene, perfluoropolyether, perfluoropolyoxetane, hexafluoropropylene oxide, siloxane, organosilicon, siloxides, ethylene oxide, propylene oxide, acrylamide, amine, ether, sulfonate, acrylic acid, maleic anhydride, vinyl acid, vinyl alcohol, vinylpyridine, or vinylpyrrolidone.

The nano-scale phase is a discontinuous phase randomly dispersed within the polymeric matrix, and can comprise nanoparticles (e.g., nanospheres and nanocubes), nanotubes, nanofibers, caged molecules, and hyperbranched molecules). The nano-scale dispersed phase can be associated or unassociated or both. The nano-scale dispersed phase can be well dispersed. Well dispersed means little agglomeration. The average dimension of the nanoscale phase can be ranged from 1 nm to 100 nm.

In some embodiments, nanostructured materials described herein the nanoscale phase is present in less than 1.25 wt. % (in some embodiments, less 1 wt. %, 0.75 wt. %, 0.5 wt. %, or even less than 0.35 wt. %), based on the total weight of the polymeric matrix and nanoscale phase.

In some embodiments, nanostructured materials described herein include the nanoscale phase in a range from 60 nm to 90 nm in size, in a range from 30 nm to 50 in size, and less than 25 nm in size, wherein the nanoscale phase is present in a range from 0.25 wt. % to 50 wt. % (in some embodiments, 1 wt. % to 25 wt. %, 5 wt. % to 25 wt. %, or even 10 wt. % to 25 wt. %) for sizes in the range from 60 nm to 90 nm, 1 wt. % to 50 wt. % (in some embodiments, 1 wt. % to 25 wt. %, or even 1 wt. % to 10 wt. %) for sizes in the range from 30 nm to 50 nm, and 0.25 wt. % to 25 wt. % (in some embodiments, 0.5 wt. % to 10 wt. %, 0.5 wt. % to 5 wt. %, or even 0.5 wt. % to 2 wt. %) for sizes less than 25 nm, based on the total weight of the polymeric matrix and nanoscale phase.

In some embodiments, nanostructured materials described herein included the nanoscale phase in a range from 60 nm to 90 nm in size, in a range from 30 nm to 50 in size, and less than 25 nm in size, wherein the nanoscale phase is present in a range from 0.1 vol. % to 35 vol. % (in some embodiments, 0.5 vol. % to 25 vol. %, 1 vol. % to 25 vol. %, or even 3 vol. % to 15 vol. %) for sizes in a range from 60 nm to 90 nm, 0.1 vol. % to 25 vol. % (in some embodiments, 0.25 vol. % to 10 vol. %, or even 0.25 vol. % to 5 vol. %) for sizes in a range from 30 nm to 50 nm, and 0.1 vol. % to 10 vol. % (in some embodiments, 0.25 vol. % to 10 vol. %, or even 0.1 vol. % to 2.5 vol. %) for sizes less than 25 nm, based on the total volume of the polymeric matrix and nanoscale phase.

In some embodiments, nanostructured materials described herein exhibit a random anisotropic nanostructured surface. The nano-structured anisotropic surface typically comprises nanofeatures having a height to width ratio of at least 2:1 (in some embodiments, at least 5:1, 10:1, 25:1, 50:1, 75:1, 100:1, 150:1, or even at least 200:1). Exemplary nanofeatures of the nano-structured anisotropic surface include nano-pillars or nano-columns, or continuous nano-walls comprising nano-pillars, nano-columns, anistropic nano-holes, or anisotropic nano-pores. In some embodiments, the nanofeatures have steep side walls that are roughly perpendicular to the functional layer-coated substrate. In some embodiments, the nano features are capped with dispersed phase material. The average height of the nanostructured surface can be from 200 nm to 500 nm with a standard deviation ranged from 20 nm to 75 nm. The nanostructural features are essentially randomized in the planar direction, and in some cases also in the z-direction.

In some embodiments of nanostructured materials described herein having the nanostructured material comprising the nanoscale phase, the nanoscale phase comprises submicrometer particles. In some embodiments, the submicrometer particles have an average particle size in a range from 1 nm to 100 nm (in some embodiments, 1 nm to 75 nm, 1 nm to 50 nm, or even 1 nm to 25 nm). In some embodiments, the submicrometer particles are covalently bonded to the polymeric matrix.

The sub-micrometer particles can comprise carbon, metals, metal oxides (e.g., $SiO_2$, $ZrO_2$, $TiO_2$, ZnO, magnesium silicate, indium tin oxide, and antimony tin oxide), carbides (e.g., SiC and WC), nitrides, borides, halides, fluorocarbon solids (e.g., poly(tetrafluoroethylene)), carbonates (e.g., calcium carbonate), and mixtures thereof. In some embodiments, sub-micrometer particles comprises at least one of $SiO_2$ particles, $ZrO_2$ particles, $TiO_2$ particles, ZnO particles, $Al_2O_3$ particles, calcium carbonate particles, magnesium silicate particles, indium tin oxide particles, antimony tin oxide particles, poly(tetrafluoroethylene) particles, or carbon particles. Metal oxide particles can be fully condensed. Metal oxide particles can be crystalline.

In some embodiments, the sub-micrometer particles can be monodisperse (all one size or unimodal) or have a distribution (e.g., bimodal, or other multimodal).

Exemplary silicas are commercially available, for example, from Nalco Chemical Co., Naperville, Ill., under the trade designation "NALCO COLLOIDAL SILICA," such as products 2329, 2329K, and 2329 PLUS. Exemplary fumed silicas include those commercially available, for example, from Evonik Degusa Co., Parsippany, N.J., under the trade designation, "AEROSIL series OX-50", as well as product numbers -130, -150, and -200; and from Cabot Corp., Tuscola, Ill., under the designations "CAB-O-SPERSE 2095", "PG002", "PG022", "CAB-O-SPERSE A105", and "CAB-O-SIL M5". Other exemplary colloidal silica are available, for example, from Nissan Chemicals under the designations "MP1040", "MP2040", "MP3040", and "MP4040".

In some embodiments, the sub-micrometer particles are surface modified. Preferably, the surface-treatment stabilizes the sub-micrometer particles so that the particles are well dispersed in the polymerizable resin, and result in a substantially homogeneous composition. The sub-micrometer particles can be modified over at least a portion of its surface with a surface treatment agent so that the stabilized particles can copolymerize or react with the polymerizable resin during curing.

In some embodiments, the sub-micrometer particles are treated with a surface treatment agent. In general, a surface treatment agent has a first end that will attach to the particle surface (covalently, ionically or through strong physisorption) and a second end that imparts compatibility of the particle with the resin and/or reacts with the resin during curing. Examples of surface treatment agents include alcohols, amines, carboxylic acids, sulfonic acids, phosphonic acids, silanes, and titanates. The preferred type of treatment agent is determined, in part, by the chemical nature of the metal oxide surface. Silanes are preferred for silica and other siliceous fillers. Silanes and carboxylic acids are preferred for metal oxides, such as zirconia. The surface modification can be done either subsequent to mixing with the monomers or after mixing. It is preferred in the case of silanes to react the silanes with the particles or nanoparticle surface before incorporation into the resins. The required amount of surface modifier is dependent on several factors such as particle size, particle type, molecular weight of the modifier, and modifier type.

Representative embodiments of surface treatment agents include compounds such as isooctyl tri-methoxy-silane, N-(3-triethoxysilylpropyl)methoxyethoxy-ethoxyethyl carbamate (PEG3TES), N-(3-triethoxysilylpropyl)methoxy-ethoxyethoxyethyl carbamate (PEG2TES), 3-(methacryloyloxy)propyltrimethoxysilane, 3-acryloxypropyltrimethoxysilane, 3-(methacryloyloxy)propyltriethoxysilane, 3-(methacryloyloxy)propylmethyldimethoxysilane, 3-(acryloyloxypropyl)methyldimethoxysilane, 3-(methacryloyloxy)propyldimethylethoxysilane, vinyldimethylethoxysilane, phenyltrimethoxysilane, n-octyltrimethoxysilane, dodecyltrimethoxysilane, octadecyltrimethoxysilane, propyltrimethoxysilane, hexyltrimethoxysilane, vinylmethyldiactoxysilane, vinylmethyldiethoxysilane, vinyltriacetoxysilane, vinyltriethoxysilane, vinyltriisopropoxysilane, vinyltrimethoxysilane, vinyltriphenoxysilane, vinyltri-t-butoxysilane, vinyltris-isobutoxysilane, vinyltriisopropenoxysilane, vinyltris(2-methoxyethoxy)silane, styrylethyltrimethoxysilane, mercaptopropyltrimethoxysilane, 3-glycidoxypropyltrimethoxysilane, acrylic acid, methacrylic acid, oleic acid, stearic acid, dodecanoic acid, 2-(2-(2-methoxyethoxy)ethoxy)acetic acid (MEEAA), beta-carboxyethylacrylate, 2-(2-methoxyethoxy)acetic acid, methoxyphenyl acetic acid, and mixtures thereof. One exemplary silane surface modifier is available, for example, from OSI Specialties, Crompton South Charleston, W. Va., under the trade designation "SILQUEST A1230". For mono-functional silane coupling agents comprising silanol groups, the silane agents can react and form covalent bonds with the hydroxyl groups on the surface of nanopartilces. For bi or multi-functional silane coupling agents comprising silanol groups and other functional groups (e.g., acrylate, epoxy, and/or vinyl), the silane agents can react and form covalent bonds with the hydroxyl groups on the surface of nanoparticles and the functional groups (e.g., acrylate, epoxy, and/or vinyl) in the polymeric matrix.

Surface modification of the particles in the colloidal dispersion can be accomplished in a variety of ways. The process involves the mixture of an inorganic dispersion with surface modifying agents. Optionally, a co-solvent can be added at this point, such as 1-methoxy-2-propanol, ethanol, isopropanol, ethylene glycol, N,N-dimethylacetamide, and 1-methyl-2-pyrrolidinone. The co-solvent can enhance the solubility of the surface modifying agents as well as the surface modified particles. The mixture comprising the inorganic sol and surface modifying agents is subsequently reacted at room or an elevated temperature, with or without mixing. In one method, the mixture can be reacted at about 85° C. for about 24 hours, resulting in the surface modified sol. In another method, where metal oxides are surface modified, the surface treatment of the metal oxide can preferably involve the adsorption of acidic molecules to the particle surface. Surface modification of the heavy metal oxide preferably takes place at room temperature.

Surface modification of $ZrO_2$ with silanes can be accomplished under acidic conditions or basic conditions. In one example, the silanes are heated under acid conditions for a suitable period of time. At which time the dispersion is combined with aqueous ammonia (or other base). This method allows removal of the acid counter ion from the $ZrO_2$ surface as well as reaction with the silane. In another method, the particles are precipitated from the dispersion and separated from the liquid phase.

A combination of surface modifying agents can be useful, for example, wherein at least one of the agents has a functional group co-polymerizable with a crosslinkable resin. For example, the polymerizing group can be ethylenically unsaturated or a cyclic group subject to ring opening polymerization. An ethylenically unsaturated polymerizing group can be, for example, an acrylate or methacrylate, or vinyl group. A cyclic functional group subject to ring opening polymerization generally contains a heteroatom, such as oxygen, sulfur, or nitrogen, and preferably a 3-membered ring containing oxygen (e.g., an epoxide).

Optionally, at least some of the submicrometer particles are functionalized with at least one multifunctional silane coupling agent comprising silanol and at least one of acrylate, epoxy, or vinyl functional groups.

The coupling agents and submicronmeter particles are typically mixed in solvents allowing silanol of coupling agents to react with hydroxyl groups on the surface of submicronmeter particles and form covalent bonds with particles at elevated temperatures. The coupling agents form covalent bonds with the submicronmeter particles providing steric hinderance between subsmicronmeter particles reducing or preventing aggregation and precipitation in solvents. Other functional groups on the coupling agents such as acrylate, methacrylate, epoxy, or vinyl can further enhance the dispersion of the functionalized submicronmeter particles in coating monomers or oligomers and in solvents.

In some embodiments, nanostructured materials described herein are in the form of a layer. In some embodiments, the layer has a thickness of at least 500 nm (in some embodiments, at least 1 micrometer, 1.5 micrometer, 2 micrometer, 2.5 micrometers, 3 micrometers, 4 micrometers, 5 micrometers, 7.5 micrometers, or even at least 10 micrometers.

In some embodiments, articles described herein, the layer further comprises in the range from 0.01 wt. % to 0.5 wt. % particles in the range from 1 micrometer to 10 micrometer particle in size. In some embodiments, articles described herein, the micrometer-scale particles can be made from wax, polytetrafluoroethylene (PTFE), polymethylmethacrylate (PMMA), polystyrene, polylactic acid (PLA), or silica. These micrometer-scale particles can be functionalized with the coupling agents as described above and dispersed in coating solutions by a blender or sonicator. The particles are typically added to coating resin binders in an amount in the range of 0.01-0.5 weight %, based on the total amount of the resin binders constituting the coatings. The particles can form "undulation" (wavy protrusions/recesses) over the entire surface of the nanostructured material to form a surface shape which provided the anti-Newton ring property when in contact with the surface of another material. This anti-Newton method can also be applied with other antireflective technologies such as traditional subwavelength scale surface gratings, multilayer antireflective coatings, ultra-low or low refractive index coatings using nano hollow sphere, porous fumed silica, or any other nanoporous coating methods to provide anti-Newton antireflective functionalities. Further details can be found, for example, in U.S. Pat. No. 6,592,950 (Toshima et al.), the disclosure of which is incorporated herein by reference.

Exemplary substrates include polymeric substrates, glass substrates or windows, and functional devices (e.g., organic light emitting diodes (OLEDs), displays, and photovoltaic devices). Typically, the substrates have thicknesses in a range from about 12.7 micrometers (0.0005 inch) to about 762 micrometers (0.03 inch), although other thicknesses may also be useful.

Exemplary polymeric materials for the substrates include polyethylene terephthalate (PET), polystyrene, acrylonitrile butadiene styrene, polyvinyl chloride, polyvinylidene chloride, polycarbonate, polyacrylates, thermoplastic polyurethanes, polyvinyl acetate, polyamide, polyimide, polypropylene, polyester, polyethylene, poly(methyl methacrylate), polyethylene naphthalate, styrene acrylonitrile copolymer, silicone-polyoxamide polymers, fluoropolymers, cellulose triacetate polymer, cyclic olefin copolymers, and thermoplastic elastomers. Semicrystalline polymers (e.g., polyethylene terephthalate (PET)) may be particularly desirable for the applications requiring good mechanical strength and dimensional stability. For other optical film applications, low birefringent polymeric substrates, such as triacetate cellulose, poly(methyl methacrylate), polycarbonate, and cyclic olefin copolymers, may be particularly desirable to minimize or avoid orientation induced polarization or dichroism interference with other optical components, such as polarizer, electromagnetic interference, or conductive touch functional layer in the optical display devices.

The polymeric substrates can be formed, for example, by melt extrusion casting, melt extrusion calendaring, melt extrusion with biaxial stretching, blown film processes, and solvent casting optionally with biaxial stretching. In some embodiments, the substrates are highly transparent (e.g., at least 90% transmittance in the visible spectrum) with low haze (e.g., less than 1%) and low birefringence (e.g., less than 50 nanometers optical retardance). In some embodiments, the substrates have a microstructured surface or fillers to provide hazy or diffusive appearance.

Optionally, the substrate is a polarizer (e.g., a reflective polarizer or an absorptive polarizer). A variety of polarizer films may be used as the substrate, including multilayer optical films composed, for example, of some combination of all birefringent optical layers, some birefringent optical layers, or all isotropic optical layers. The multilayer optical films can have ten or less layers, hundreds, or even thousands of layers. Exemplary multilayer polarizer films include those used in a wide variety of applications such as liquid crystal display devices to enhance brightness and/or reduce glare at the display panel. The polarizer film may also be the type used in sunglasses to reduce light intensity and glare. The polarizer film may comprise a polarizer film, a reflective polarizer film, an absorptive polarizer film, a diffuser film, a brightness enhancing film, a turning film, a mirror film, or a combination thereof. Exemplary reflective polarizer films include those reported in U.S. Pat. No. 5,825,543 (Ouderkirk et al.) U.S. Pat. No. 5,867,316 (Carlson et al.), U.S. Pat. No. 5,882,774 (Jonza et al.), U.S. Pat. No. 6,352,761 B1 (Hebrink et al.), U.S. Pat. No. 6,368,699 B1 (Gilbert et al.), and U.S. Pat. No. 6,927,900 B2 (Liu et al.), U.S. Pat. Appl. Pub. Nos. 2006/0084780 A1 (Hebrink et al.), and 2001/0013668 A1 (Neavin et al.), and PCT Pub.

Nos. WO95/17303 (Ouderkirk et al.), WO95/17691 (Ouderkirk et al), WO95/17692 (Ouderkirk et al.), WO95/17699 (Ouderkirk et al.), WO96/19347 (Jonza et al.), WO97/01440 (Gilbert et al.), WO99/36248 (Neavin et al.), and WO99/36262 (Hebrink et al.), the disclosures of which are incorporated herein by reference. Exemplary reflective polarizer films also include those commercially available from 3M Company, St. Paul, Minn., under the trade designations "VIKUITI DUAL BRIGHTNESS ENHANCED FILM (DBEF)", "VIKUITI BRIGHTNESS ENHANCED FILM (BEF)", "VIKUITI DIFFUSE REFLECTIVE POLARIZER FILM (DRPF)", "VIKUITI ENHANCED SPECULAR REFLECTOR (ESR)", and "ADVANCED POLARIZER FILM (APF)". Exemplary absorptive polarizer films are commercially available, for example, from Sanritz Corp., Tokyo, Japan, under the trade designation of "LLC2-5518SF".

The optical film may have at least one non-optical layer (i.e., a layer(s) that does not significantly participate in the determination of the optical properties of the optical film). The non-optical layers may be used, for example, to impart or improve mechanical, chemical, or optical, properties; tear or puncture resistance; weatherability; or solvent resistance.

Exemplary glass substrates include sheet glass (e.g., soda-lime glass) such as that made, for example, by floating molten glass on a bed of molten metal. Other exemplary glass substrates include borosilicate glass, LCD glass and chemically strengthened glass. In some embodiments (e.g., for architectural and automotive applications), it may be desirable to include a low-emissivity (low-E) coating on a surface of the glass to improve the energy efficiency of the glass. Other coatings may also be desirable in some embodiments to enhance the electro-optical, catalytic, or conducting properties of glass.

One method for making nanostructured materials described herein comprises:
providing a polymeric matrix comprising a nanodispersed phase; and
anisotropically etching the polymeric matrix using plasma to form a random nanostructured surface.

In some embodiments, the matrix is etched to a depth of at least in a range from 200 nm to 500 nm. Highly directional ionized plasma etching under high vacuum with high biased voltage, for example, can enable deeper etching for greater than 200 nm. Effective directional reactive and physical ions bombardments are formed under high vacuum and biased voltage to allow deeper penetration of plasma into the surface while minimizing side etching.

Another method for making nanostructured materials described herein comprises:
providing a polymeric matrix comprising a nanodispersed phase; and
etching at least a portion of the polymeric matrix using plasma (e.g., $O_2$, Ar, $CO_2$, $O_2/Ar$, $O_2/CO_2$, $C_6F_{14}/O_2$, or $C_3F_8/O_2$ plasma) to form a random nanostructured surface. Optionally. the nanostructured surface is treated at least a second time with plasma. In some embodiments, the method is performed roll-to-roll using cylindrical reactive ion etching. In some embodiments, the etching is carried out at a pressure of about 1 mTorr to about 20 mTorr.

Nanostructured materials described herein exhibit an average reflection at 60 degrees off angle less than 1 percent (in some embodiments, less than 0.75, 0.5, 0.25, or less than 0.2 percent). The reflection at 60 degree off angle is measured by Procedure 2 in the Examples below.

In another aspect, nanostructured materials described herein have a reflection less than 2 percent (in some embodiments, less than 1.5 percent or even less than 0.5 percent) as measured by Procedure 2 in the Examples below. The nanostructured materials described herein can have a haze less than 3 percent (in some embodiments, less than 2 percent, 1.5 percent, or even less than 1 percent) as measured by Procedure 3 in the Examples below.

For articles comprising, in order, a substrate, functional layer, and a layer of nanostructured material described herein, the article can be made, for example, by a method comprising:
providing a substrate having first and second generally opposed major surfaces and the functional layer having opposing first and second major surfaces, wherein the first major surface of the functional layer is disposed on the first major surface of the substrate;
coating a composition comprising at least one of a polymeric matrix or a polymeric precursor matrix and a nano-scale dispersed phase in the at least one of the polymeric matrix or the polymeric precursor matrix on the first major surface of the functional layer;
optionally drying the coating (and optionally curing the dried coating) to provide an article comprising the at least one of the polymeric matrix or the polymeric precursor matrix and a nano-scale dispersed phase in the at least one of the polymeric matrix or the polymeric precursor matrix;
exposing the second major surface of the article to reactive ion etching, wherein the ion etching comprises:
placing the article on a cylindrical electrode in a vacuum vessel;
introducing etchant gas to the vacuum vessel at a predetermined pressure (e.g., in a range from 1 milliTorr to 20 milliTorr);
generating plasma (e.g., an oxygen plasma) between the cylindrical electrode and a counter-electrode;
rotating the cylindrical electrode to translate the substrate; and
anisotropically etching the coating to provide the random nano-structured anisotropic surface.

For composites further comprising in order relative to the substrate, a second functional layer, and a second nano-structured article, the method can be conducted, for example, by providing the substrate with the functional layer (which may be the same of different) on each major surface of the substrate, and applying the second nano-structured article on the functional layer as described above in the method. In some embodiments, the second nano-structured article is applied simultaneously with the first nano-structured article. In some embodiments, the second functional layer is provided after the first nano-structured article applied, while in others, for example, during the application of the first nano-structured article.

For composites described herein comprising, in order, a substrate, a layer of nanostructured material described herein, and a functional layer, the composite can be made, for example, by a method comprising:
providing a substrate having first and second generally opposed major surfaces;
coating a composition comprising at least one of a polymeric matrix material or a polymeric precursor matrix and a nano-scale dispersed phase in the at least one of the polymeric matrix or the polymeric precursor matrix on the first major surface of the substrate;
optionally drying the coating (and optionally curing the dried coating) to provide an article comprising the at least one of the polymeric matrix or the polymeric precursor matrix and a nano-scale dispersed phase in the at least one of polymeric matrix or the polymeric precursor matrix;

exposing a major surface of the article to reactive ion etching, wherein the ion etching comprises:

placing the article on a cylindrical electrode in a vacuum vessel;

introducing etchant gas to the vacuum vessel at a predetermined pressure (e.g., in a range from 1 milliTorr to 20 milliTorr);

generating plasma (e.g., an oxygen plasma) between the cylindrical electrode and a counter-electrode;

rotating the cylindrical electrode to translate the substrate; and anisotropically etching the coating to provide the first random nano-structured anisotropic surface; and disposing a functional layer on the random nano-structured anisotropic surface.

For composites further comprising in order relative to the substrate, a second nano-structured article, and a second functional layer, said method can be conducted, for example, by applying the second nano-structured article on the functional layer as described above in the method, and then disposing a functional layer (which may be the same or different) on a major surface of the second nano-structured article. In some embodiments, the second nano-structured article is applied simultaneously with the first nano-structured article. In some embodiments, the second functional layer is provided after the first nano-structured article applied, while in others, for example, during the application of the first nano-structured article.

There are several deposition techniques used to form the transparent conductive films, including chemical vapor deposition (CVD), magnetron sputtering, evaporation, and spray pyrolysis. Glass substrates have been widely used for making organic light emitting diodes. Glass substrates, however, tend to be undesirable for certain applications (e.g., electronic maps and portable computers). Where flexibility is desired, glass is brittle and hence undesirable. Also, for some applications (e.g., large area displays) glass is too heavy. Plastic substrates are an alternative to glass substrates. The growth of transparent conductive films on plastic substrates by low temperature (25° C.-125° C.) sputtering is reported, for example, by Gilbert et al., $47^{th}$ Annual Society of Vacuum Coaters Technical Conference Proceedings (1993), T. Minami et al., Thin Solid Film, Vol. 270, page 37 (1995), and J. Ma, Thin Solid Films, vol. 307, page 200 (1997). Another deposition technique, pulsed laser deposition, is reported, for example, in U.S. Pat. No. 6,645,843 (Kim et al.), wherein a smooth, low electrical resistivity indium-tin-oxide (ITO) coating is formed on a polyethylene terephthalate (PET) substrate. The electrically-conductive layer can include a conductive elemental metal, a conductive metal alloy, a conductive metal oxide, a conductive metal nitride, a conductive metal carbide, a conductive metal boride, and combinations thereof. Preferred conductive metals include elemental silver, copper, aluminum, gold, palladium, platinum, nickel, rhodium, ruthenium, aluminum, and zinc. Alloys of these metals, such as silver-gold, silver-palladium, silver-gold-palladium, or dispersions containing these metals in admixture with one another or with other metals also can be used. Transparent conductive oxides (TCO), such as indium-tin-oxide (ITO), indium-zinc-oxide (IZO), zinc oxide, with or without, dopants, such as aluminum, gallium and boron, other TCOs, and combinations thereof can also be used as an electrically-conductive layer. Preferably, the physical thickness of an electrically-conductive metallic layer is in a range from about 3 nm to about 50 nm (in some embodiments, about 5 nm to about 20 nm), whereas the physical thickness of the transparent conductive oxide layers are preferably in a range from about 10 nm to about 500 nm (in some embodiments, about 20 nm to about 300 nm). The resulting electrically-conductive layer can typically provide a sheet resistance of less than 300 ohms/sq. (in some embodiments, less than 200 ohms/sq., or even less than 100 ohms/sq.). For functional layers applied to a structured surface, the layer may follow the surface contour of the structured surface so that the antireflection function is created at the interface between the structured surface and the deposited layer, and at the second surface of the functional coating layer contacting air or the surface of another substrate.

Transparent conductive films can be made, for example, from transparent conductive polymers. Conductive polymers include derivatives of polyacetylene, polyaniline, polypyrrole, PETOT/PSS (poly(3,4-ethylenedioxythiophene)/polystyrenesulfonic acid), or polythiophenes (see, e.g., Skotheim et al., Handbook of Conducting Polymers, 1998). Although not wanting to be bound by theory, it is believed that these polymers have conjugated double bonds which allow for conduction. Further, although not wanting to be bound by theory, it is believed that by manipulating the band structure, polythiophenes have been modified to achieve a HUMO-LUMO separation that is transparent to visible light. In a polymer, the band structure is determined by the molecular orbitals. The effective bandgap is the separation between the highest occupied molecular orbital (HOMO) and lowest unoccupied molecular orbital (LUMO).

The transparent conductive layer can comprise, for example, anisotropic nano-scale materials which can be solid or hollow. Solid anisotropic nano-scale materials include nanofibers and nanoplatelets. Hollow anisotropic nano-scale materials include nanotubes. Typically, the nanotube has an aspect ratio (length:diameter) greater than 10:1 (in some embodiments, greater than 50:1, or even greater than 100:1). The nanotubes are typically greater than 500 nm (in some embodiments, greater than 1 micrometer, or even greater than 10 micrometers) in length. These anisotropic nano-scale materials can be made from any conductive material. Most typically, the conductive material is metallic. The metallic material can be an elemental metal (e.g., transition metals) or a metal compound (e.g., metal oxide). The metallic material can also be a metal alloy or a bimetallic material, which comprises two or more types of metal. Suitable metals include silver, gold, copper, nickel, gold-plated silver, platinum, and palladium. The conductive material can also be non-metallic (e.g., carbon or graphite (an allotrope of carbon)).

Gas (e.g., water vapor and oxygen) barrier films typically comprise a relatively thin (e.g., about 100 nm to about 300 nm) layer of a metal oxide, such as aluminum oxide, magnesium oxide, or silicon oxide on a film surface. Other exemplary layers on films to provide a gas barrier film include ceramics, such as silicon oxide, silicon nitride, aluminum oxide nitride, magnesium oxide, zinc oxide, indium oxide, tin oxide, tin-doped indium oxide, and aluminum-doped zinc oxide. Gas barrier films can be a single barrier layer or multiple barrier layers construction. The barrier layer may also comprise multifunctional properties such as conductive functionality.

In some embodiments, the surface of the polymeric matrix comprising the sub-micrometer particles may be microstructured. For example, a transparent conductive oxide-coated substrate, with a v-groove microstructured surface can be coated with polymerizable matrix materials comprising the sub-micrometer particles and treated by plasma etching to form nanostructures on v-groove microstructured surface. Other examples include a fine microstructured surface resulting from controlling the solvent evaporation process from multi-solvent coating solutions, reported as in U.S. Pat. No. 7,378,136 (Pokorny et al.); or the structured surface from the micro-replication method reported in U.S. Pat. No. 7,604,381 (Hebrink et al.); or any other structured surface induced, for example, by electrical and magnetic fields.

Optionally, articles described herein further comprise an optically clear adhesive disposed on the second surface of the substrate. The optically clear adhesives that may be used in the present disclosure preferably are those that exhibit an optical transmission of at least about 90%, or even higher, and a haze value of below about 5% or even lower, as measured on a 25 micrometer thick sample in the matter described below in the Example section under the Haze and Transmission Tests for optically clear adhesive. Suitable optically clear adhesives may have antistatic properties, may be compatible with corrosion sensitive layers, and may be able to be released from the substrate by stretching the adhesive. Illustrative optically clear adhesives include those described in PCT Pub. No. WO 2008/128073 (Everaerts et al.) relating to antistatic optically clear pressure sensitive adhesive; U.S. Pat. Appl. Pub. No. US 2009/0229732A1 (Determan et al.) relating to stretch releasing optically clear adhesive; U.S. Pat. Appl. Pub. No. US 2009/0087629 (Everaerts et al.) relating to indium tin oxide compatible optically clear adhesive; U.S. Pat. Appl. Pub. No. US 2010/0028564 (Everaerts et al.) relating to antistatic optical constructions having optically transmissive adhesive; U.S. Pat. Appl. Pub. No. 2010/0040842 (Everaerts et al.) relating to adhesives compatible with corrosion sensitive layers; PCT Pub. No. WO 2009/114683 (Determan et al.) relating to optically clear stretch release adhesive tape; and PCT Pub. No. WO 2010/078346 (Yamanaka et al.) relating to stretch release adhesive tape. In one embodiment, the optically clear adhesive has a thickness of up to about 5 micrometer.

In some embodiments, articles described herein further comprise a hardcoat comprising at least one of $SiO_2$ nanoparticles or $ZrO_2$ nanoparticles dispersed in a crosslinkable matrix comprising at least one of multi(meth)acrylate, polyester, epoxy, fluoropolymer, urethane, or siloxane (which includes blends or copolymers thereof). Commercially available liquid-resin based materials (typically referred to as "hardcoats") may be used as the polymeric matrix or as a component of the polymeric matrix. Such materials include that available from California Hardcoating Co., San Diego, Calif., under the trade designation "PERMANEW"; and from Momentive Performance Materials, Albany, N.Y., under the trade designation "UVHC". Additionally, commercially available nanoparticle filled polymeric matrix materials may be used such as those available from Nanoresins AG, Geesthacht Germany, under the trade designations "NANOCRYL" and "NANOPDX".

In some embodiments, the articles described herein further comprises a surface protection adhesive sheet (laminate premasking film) having a releasable adhesive layer formed on the entire area of one side surface of a film, such as a polyethylene film, a polypropylene film, a vinyl chloride film, or a polyethylene terephthalate film to the surface of the articles, or by superimposing the above-mentioned polyethylene film, a polypropylene film, a vinyl chloride film, or a polyethylene terephthalate film on the surface of articles.

Exemplary Embodiments

1A. A nanostructured material exhibiting a random anisotropic nanostructured surface, and exhibiting an average reflection at 60 degrees off angle less than 1 percent (in some embodiments, less than 0.75, 0.5, 0.25, or less than 0.2 percent).

2A. The nanostructured material of Embodiment 1A comprising a polymeric matrix and a nanoscale dispersed phase.

3A. The nanostructured material of Embodiment 2A, wherein the nanoscale phase is present in a range from 60 nm to 90 nm in size, in a range from 30 nm to 50 in size, and less than 25 nm in size, and wherein the nanoscale phase is present in a range from 0.25 wt. % to 50 wt. % (in some embodiments, 1 wt. % to 25 wt. %, 5 wt. % to 25 wt. %, or even 10 wt. % to 25 wt. %) for sizes in the range from 60 nm to 90 nm, 1 wt. % to 50 wt. % (in some embodiments, 1 wt. % to 25 wt. %, or even 1 wt. % to 10 wt. %) for sizes in a range from for sizes in the range from 30 nm to 50 nm, and 0.25 wt. % to 25 wt. % (in some embodiments, 0.5 wt. % to 10 wt. %, 0.5 wt. % to 5 wt. %, or even 0.5 wt. % to 2 wt. %) for sizes less than 25 nm, based on the total weight of the polymeric matrix and nanoscale phase.

4A. The nanostructured material of either Embodiment 2A or 3A, wherein the nanoscale phase is present in a range from 60 nm to 90 nm in size, in a range from 30 nm to 50 in size, and less than 25 nm in size, and wherein the nanoscale phase is present in the range from 0.1 vol. % to 35 vol. % (in some embodiments, 0.5 vol. % to 25 vol/%, 1 vol. % to 25 vol. %, or even 3 vol. % to 15 vol. %) for sizes in the range from 60 nm to 90 nm, 0.1 vol. % to 25 vol. % (in some embodiments, 0.25 vol. % to 10 vol. %, or even 0.25 vol. % to 5 vol. %) for sizes in a range from 30 nm to 50 nm, and 0.1 vol. % to 10 vol. % (in some embodiments, 0.25 vol. % to 10 vol. %, or even 0.1 vol. % to 2.5 vol. %) for sizes less than 25 nm, based on the total volume of the polymeric matrix and nanoscale phase.

5A. The nanostructured material of any of Embodiments 2A to 4A, wherein at least a portion of the polymeric matrix comprises at least one of tetrafluoroethylene, vinylfluoride, vinylidene fluoride, chlorotrifluoroethylene, perfluoroakoxy, fluorinated ethylene-propylene, ethylenetetrafluoroethylene, ethylenechlorotrifluoroethylene, perfluoropolyether, perfluoropolyoxetane, hexafluoropropylene oxide, siloxane, organosilicon, siloxides, silyl halides, ethylene oxide, propylene oxide, acrylamide, amine, ether, sulfonate, acrylic acid, maleic anhydride, vinyl acid, vinyl alcohol, vinylpyridine, or vinylpyrrolidone.

6A. The nanostructured material of any preceding Embodiment A, wherein the nanoscale phase comprises submicrometer particles.

7A. The nanostructured material of Embodiment 6A, wherein the submicrometer particles have an average particle size in a range from 1 nm to 100 nm (in some embodiments, 1 nm to 75 nm, 1 nm to 50 nm, or even 1 nm to 25 nm), and wherein the nanoscale phase is present in less than 1.25 wt. % (in some embodiments, less 1 wt. %, 0.75 wt. %, 0.5 wt. %, or even less than 0.35 wt. %), based on the total weight of the polymeric matrix and nanoscale phase.

8A. The nanostructured material of either Embodiment 2A to 7A, wherein the submicrometer particles are covalently bonded to the polymeric matrix.

9A. The nanostructured material of any of Embodiments 2A to 8A, wherein at least some of the submicrometer particles are functionalized with at least one multifunctional silane coupling agent comprising silanol and at least one of acrylate, epoxy, or vinyl functional groups.

10A. The nanostructured material of any of Embodiments 2A to 9A, wherein the submicrometer particles comprise at least one of carbon, metal, metal oxide, metal carbide, metal nitride, or diamond.

11A. The nanostructured material of any of Embodiments 2A to 10A, the polymeric matrix (e.g., cross linkable material) comprises at least one of acrylate, urethane acrylate, methacrylate, polyester, epoxy, fluoropolymer, or siloxane.

12A. The nanostructured material of any preceding Embodiment A, wherein the nanostructured anisotropic surface comprises nanoscale features having a height to width ratio of at least 2:1 (in some embodiments, at least 10:1).

13A. The nanostructured material of any preceding Embodiment A that is a layer.

14A. The layer of Embodiment 13A having a thickness of at least 500 nm (in some embodiments, at least 1 micrometer, 1.5 micrometer, 2 micrometer, 2.5 micrometers, 3 micrometers, 4 micrometers, 5 micrometers, 7.5 micrometers, or even at least 10 micrometers).

15A. An article comprising a substrate having first and second generally opposed major surfaces with the layer of either Embodiment 13A or 14A on the first major surface.

16A. The article of Embodiment 15A, wherein the substrate is a polarizer (e.g., reflective polarizer or absorptive polarizer).

17A. The article of either Embodiment 15A or 16A, wherein the first major surface of the substrate has a microstructured surface.

18A. The article of any of Embodiments 15A to 17A having a haze less than 2 percent (in some embodiments, less than 1.5 percent, 1 percent, 0.75 percent, 0.5 percent or even less than 0.3 percent).

19A. The article of any of Embodiments 15A to 18A further comprising a hardcoat comprising at least one of $SiO_2$ nanoparticles or $ZrO_2$ nanoparticles dispersed in a crosslinkable matrix comprising at least one of multi(meth)acrylate, polyester, epoxy, fluoropolymer, urethane, or siloxane.

20A. The article of any of Embodiments 15A to 19A having a visible light transmission of at least 90 percent (in some embodiments, at least 94 percent, 95 percent, 96 percent, 97 percent, 98 percent, 99 percent, or even 100 percent).

21A. The article of any of Embodiments 15A to 20A, further comprising a functional layer disposed between the first major surface of the substrate and the layer, wherein the functional layer is at least one of a transparent conductive layer or a gas barrier layer.

22A. The article of any of Embodiments 15A to 21A, further comprising a pre-mask film disposed on the layer.

23A. The article of any of Embodiments 15A to 21A, further comprising a functional layer disposed on the layer, wherein this functional layer is at least one of a transparent conductive layer or a gas barrier layer.

24A. The article of any of Embodiments 15A to 21A or 23A further comprising a functional layer disposed on the second major surface of the substrate, wherein this functional layer is at least one of a transparent conductive layer or a gas barrier layer.

25A. The article of any of Embodiments 15A to 21A or 23A, further comprising an optically clear adhesive disposed on the second surface of the substrate, the optically clear adhesive having at least 90% transmission in visible light and less than 5% haze.

26A. The article of Embodiment 25A further comprising a major surface of a glass substrate attached to the optically clear adhesive.

27A. The article of Embodiment 25A, further comprising a major surface of a polarizer substrate attached to the optically clear adhesive.

28A. The article of Embodiment 25A further comprising a major surface of a touch sensor attached to the optically clear adhesive.

29A. The article of Embodiment 25A, further comprising a release liner disposed on the second major surface of the optically clear adhesive.

1B. A method of making the nanostructured material of any of Embodiments 1A to 12A, the method comprising:
 providing a polymeric matrix comprising a nanodispersed phase; and
 anisotropically etching the polymeric matrix using plasma to form the random nanostructured surface.

2B. The method of Embodiment 1B, wherein the polymeric matrix is etched to a depth of at least in a range from 200 nm to 500 nm.

1C. A method of making the nanostructured material of any of Embodiments 1A to 12A, the method comprising:
 providing a polymeric matrix comprising a nanodispersed phase; and
 etching at least a portion of the polymeric matrix using plasma to form the random nanostructured surface.

2C. The method of Embodiment 1C further comprising treating the nanostructured surface with plasma a second time.

3C. The method of either Embodiment 1C or 2C, wherein the method is performed roll-to-roll using cylindrical reactive ion etching.

4C. The method of any preceding Embodiment C, wherein the etching is carried out at a pressure of about 1 mTorr to about 20 mTorr.

5C. The method of any preceding Embodiment C, wherein the plasma is $O_2$, Ar, $CO_2$, $O_2/Ar$, $O_2/CO_2$, $C_6F_{14}/O_2$, or $C_3F_8/O_2$ plasma.

Advantages and embodiments of this invention are further illustrated by the following examples, but the particular materials and amounts thereof recited in these examples, as well as other conditions and details, should not be construed to unduly limit this invention. All parts and percentages are by weight unless otherwise indicated.

EXAMPLES

Procedure 1—Plasma Treatment of Roll-to-Roll Samples

The cylindrical RIE apparatus shown in FIG. 1 of PCT Pub. No. WO2010/078306A2 (Moses et al.), published in 2010, the disclosure of which is incorporated by reference, was used to treat polymeric film. The width of the drum electrode was 42.5 inches (108 cm). Pumping was carried out by means of a turbo-molecular pump.

Rolls of polymeric film were mounted within the chamber, the film wrapped around the drum electrode and secured to the take up roll on the opposite side of the drum. The unwind and take-up tensions were maintained at 3 pounds (13.3 N). The chamber door was closed and the chamber pumped down to a base pressure of $5\times10^{-4}$ Torr. Oxygen was then introduced into the chamber. The operating pressure was nominally 5 mTorr. Plasma was generated by applying a power of 5000 watts of radio frequency energy to the drum. The drum was rotated so that the film was transported at a desired speed for the specific etching time as stated in the specific example. For a piece-part film, the sample was either attached to a web carrier or to the surface of drum electrode to be treated at a desired speed for the specific etching time as stated in the specific example.

Procedure 2—Measurement of 60° Off Angle Average % Reflection

The average % reflection (% R) of the plasma treated surface was measured using a UV/Vis/NIR Scanning Spectrophotometer (obtained from PerkinElmer. Walthan, Mass., under the trade designation "PERKINELMER LAMBDA 950 URA UV-VIS-NIR SCANNING SPECTROPHOTOMETER"). One sample of each film was prepared by applying black vinyl tape to the backside of the sample. The black tape was laminated to the backside of the sample using a roller to ensure there were no air bubbles trapped between the black tape and the sample. The front surface % reflection (specular) of a sample was measured by placing the sample in the machine so that the non-tape side was against the aperture. The % reflection was measured at a 60° off angle and average % reflection was calculated for the wavelength range of 400-700 nm.

Procedure 3—Measurement of Transmission and Haze

The measurement of average % transmission and haze was carried with a haze meter (obtained under the trade designation "BYK HAZEGARD PLUS" from BYK Gardiner) according to ASTM D1003-11 (2011), the disclosures of which are incorporated herein by reference.

Functionalized 15 nm $SiO_2$ Dispersion

A dispersion of functionalized 15 nm $SiO_2$ dispersed in UV curable resin comprising photoinitiator was obtained from Momentive Performance Materials, Wilton, Conn., under the trade designation "UVHC8558"). The weight percentage of 15 nm $SiO_2$ in the dispersion is about 20 wt. %.

Functionalized 75 nm $SiO_2$ Dispersion 400 gm of 75 nm silica particles (obtained from Nalco Chemical Co., Naperville, Ill., under the trade designation "NALCO 2329K") was charged into a 1 quart (0.95 liter) jar. Four hundred fifty grams of 1-methoxy-2-propanol, 9.2 grams of 3-(Methacryloyloxy)propyltrimethoxy silane, and 0.23 gram of hindered amine nitroxide inhibitor (obtained from Ciba Specialty Chemical, Inc., Tarrytown, N.Y., under the trade designation "PROSTAB 5128") in water at 5 wt. % inhibitor were mixed together and added to the jar while stirring. The jar was sealed and heated to 80° C. for 16 hours to form a surface-modified silica dispersion. The water was further removed from the mixture via rotary evaporation to form a solution of 42.4 percent by weight 75 nm $SiO_2$ in 1-methoxy-2-propanol.

Coating Monomers and Photo-Initiator

Trimethylolpropantriacrylate (TMPTA) and 1,6-hexanediol diacrylate (HDDA) were obtained from Sartomer, under the trade designation "SR351" and "SR238", respectively. Photoinitiator was obtained from BASF Specialty Chemicals under the trade designation "IRGACURE 184").

Examples 1-9 and Comparative Examples 1-3

Coating compositions 1-6 for Examples 1-9 and Comparative Examples 1-3 were prepared from mixing functionalized 15 nm $SiO_2$ dispersion ("UVHC8558") with trimethylolpropantriacrylate (TMPTA) (obtained from Sartomer, Exton, Pa., under the trade designation "SR351") and 1,6-hexanediol diacrylate (HDDA) (obtained from Sartomer under the trade designation "SR238") to form 40 wt. % solids in 1-methoxoy-2-propanol (PM) and methyl ethyl ketone (MEK). The compositions of coating compositions 1-6 are provided in Table 1, below.

TABLE 1

| | Wt. % 15 nm $SiO_2$ in coating (solid) | 15 nm $SiO_2$ coating compositions (grams) | | | | |
|---|---|---|---|---|---|---|
| | | "UVHC8558" | "SR351" | "SR238" | PM | MEK |
| Composition 1 | 0.5 | 0.20 | 5.88 | 1.96 | 8.40 | 3.6 |
| Composition 2 | 1 | 0.40 | 5.76 | 1.92 | 8.40 | 3.6 |
| Composition 3 | 2 | 0.80 | 5.52 | 1.84 | 8.40 | 3.6 |
| Composition 4 | 3 | 1.20 | 5.28 | 1.76 | 8.40 | 3.6 |
| Composition 5 | 4 | 1.60 | 5.04 | 1.68 | 8.40 | 3.6 |
| Composition 6 | 6 | 2.40 | 4.56 | 1.52 | 8.40 | 3.6 |

These coatings compositions were applied on 80 micrometer thick triacetate cellulose film (obtained from Fuji Film Corporation, Tokyo, Japan, under the trade designation "FUJI TAC FILM") using a Meyer rod (#4 bar) coating device. The coated substrates were dried at room temperature inside a ventilated hood for 5 minutes, and then cured using a UV processor equipped with a H-Bulb under a nitrogen atmosphere at 50 fpm (15.24 meter/minute).

The cured coated films were then subjected to the 02 plasma etching process described in Procedure 1 for various etching times (see Table 2, below). The optical properties of the etched samples were measured according to Procedures 2 and 3, and are reported in Table 2, below.

TABLE 2

| | Coating Composition | Wt. % 15 nm $SiO_2$ | Etching time (sec) | 60 degree ave % R | Transmission | Haze |
|---|---|---|---|---|---|---|
| Example 1 | 1 | 0.5 | 300 | 0.21 | 96.8 | 0.88 |
| Example 2 | 2 | 1 | 300 | 0.32 | 96.9 | 0.67 |
| Example 3 | 3 | 2 | 300 | 0.90 | 96.8 | 0.77 |
| Example 4 | 4 | 3 | 300 | 0.50 | 96.6 | 1.22 |
| Example 5 | 5 | 4 | 300 | 0.71 | 96.7 | 1.14 |
| Example 6 | 1 | 0.5 | 180 | 0.34 | 96.8 | 0.32 |
| Example 7 | 2 | 1 | 180 | 0.83 | 96.8 | 0.37 |
| Example 8 | 1 | 0.5 | 150 | 0.46 | 96.7 | 0.25 |
| Example 9 | 2 | 1 | 150 | 0.82 | 96.7 | 0.31 |
| C Example 1 | 6 | 6 | 300 | 1.23 | 96.7 | 0.92 |
| C Example 2 | 6 | 6 | 180 | 1.71 | 96.7 | 0.41 |
| C Example 3 | 6 | 6 | 150 | 2.08 | 96.6 | 0.33 |

Examples 10-11

The coating composition for Examples 10-11 as prepared from mixing functionalized 75 nm $SiO_2$ dispersion with trimethylolpropantriacrylate (TMPTA) ("SR351") and 1,6-hexanediol diacrylate (HDDA) ("SR238") to form 40 wt. % solids in 1-methoxoy-2-propanol (PM) and methyl ethyl ketone (MEK). The compositions are provided in Table 3, below.

TABLE 3

| | Wt. % 75 nm SiO$_2$ in coating (solid) | 75 nm SiO$_2$ coating compositions (grams) | | | | | |
|---|---|---|---|---|---|---|---|
| | | 42.4 wt % 75 nm SiO$_2$ dispersion | "SR351" | "SR238" | PM | MEK | "IRG184" |
| Composition 7 | 15 | 2.830 | 5.1 | 1.7 | 6.80 | 3.6 | 0.24 |

The coating composition was applied on 80 micrometers triacetate cellulose film ("FUJI TAC FILM") using a Meyer rod (#4 bar) coating device. The coated substrate was dried at room temperature inside a ventilated hood for 5 minutes, and then cured using a UV processor equipped with a H-Bulb under a nitrogen atmosphere at 50 fpm (15.24 meter/minute).

The cured coated films were then subjected to the O$_2$ plasma etching process described in Procedure 1 for various etching times (see Table 4, below). The optical properties of the etched samples were measured according to Procedures 2 and 3, and are reported in Table 4, below.

TABLE 4

| | Coating Composition | Wt. % 75 nm SiO$_2$ | Etching time (sec) | 60 degree ave % R | Transmission | Haze |
|---|---|---|---|---|---|---|
| Example 10 | 7 | 15 | 150 | 0.95 | 97.2 | 0.43 |
| Example 11 | 7 | 15 | 180 | 0.88 | 97 | 0.65 |

Foreseeable modifications and alterations of this disclosure will be apparent to those skilled in the art without departing from the scope and spirit of this invention. This invention should not be restricted to the embodiments that are set forth in this application for illustrative purposes.

What is claimed is:

1. A method of making a nanostructured layer comprising a polymeric matrix and a nanoscale dispersed phase, the layer having a random anisotropic nanostructured surface, the random anisotropic nanostructured surface having an average reflection at 60 degrees off angle less than 1 percent, the layer having a thickness of at least 500 nm, and the layer having a visible light transmission through the thickness of the layer at 90 degrees to the random anisotropic nanostructured surface of at least 94 percent, the method comprising:
    providing the polymeric matrix comprising the nanodispersed phase; and
    anisotropically etching the polymeric matrix using plasma to form the random nanostructured surface.

2. A method of making a nanostructured layer comprising a polymeric matrix and a nanoscale dispersed phase, the layer having a random anisotropic nanostructured surface, the random anisotropic nanostructured surface having an average reflection at 60 degrees off angle less than 1 percent, the layer having a thickness of at least 500 nm, and the layer having a visible light transmission through the thickness of the layer at 90 degrees to the random anisotropic nanostructured surface of at least 94 percent, the method comprising:
    providing the polymeric matrix comprising the nanodispersed phase; and
    etching at least a portion of the polymeric matrix using plasma to form the random nanostructured surface.

3. The method of claim 1, wherein the nanoscale phase is present in a range from 60 nm to 90 nm in size, in a range from 30 nm to 50 nm in size, and less than 25 nm in size, and wherein the nanoscale phase is present in a range from 0.25 wt. % to 50 wt. % for sizes in the range from 60 nm to 90 nm, 1 wt. % to 50 wt. % for sizes in a range from for sizes in the range from 30 nm to 50 nm, and 0.25 wt. % to 25 wt. % for sizes less than 25 nm, based on the total weight of the polymeric matrix and nanoscale phase.

4. The method of claim 1, wherein the nanoscale phase is present in a range from 60 nm to 90 nm in size, in a range from 30 nm to 50 nm in size, and less than 25 nm in size, and wherein the nanoscale phase is present in the range from 0.1 vol. % to 35 vol. % for sizes in the range from 60 nm to 90 nm, 0.1 vol. % to 25 vol. % for sizes in a range from 30 nm to 50 nm, and 0.1 vol. % to 10 vol. % for sizes less than 25 nm, based on the total volume of the polymeric matrix and nanoscale phase.

5. The method of claim 1, wherein the nanoscale phase comprises submicrometer particles.

6. The method of claim 1, wherein the submicrometer particles are covalently bonded to the polymeric matrix.

7. The method of claim 2, wherein the nanoscale phase is present in a range from 60 nm to 90 nm in size, in a range from 30 nm to 50 nm in size, and less than 25 nm in size, and wherein the nanoscale phase is present in a range from 0.25 wt. % to 50 wt. % for sizes in the range from 60 nm to 90 nm, 1 wt. % to 50 wt. % for sizes in a range from for sizes in the range from 30 nm to 50 nm, and 0.25 wt. % to 25 wt. % for sizes less than 25 nm, based on the total weight of the polymeric matrix and nanoscale phase.

8. The method of claim 2, wherein the nanoscale phase is present in a range from 60 nm to 90 nm in size, in a range from 30 nm to 50 nm in size, and less than 25 nm in size, and wherein the nanoscale phase is present in the range from 0.1 vol. % to 35 vol. % for sizes in the range from 60 nm to 90 nm, 0.1 vol. % to 25 vol. % for sizes in a range from 30 nm to 50 nm, and 0.1 vol. % to 10 vol. % for sizes less than 25 nm, based on the total volume of the polymeric matrix and nanoscale phase.

9. The method of claim 2, wherein the nanoscale phase comprises submicrometer particles.

10. The method of claim 2, wherein the submicrometer particles are covalently bonded to the polymeric matrix.

* * * * *

UNITED STATES PATENT AND TRADEMARK OFFICE
CERTIFICATE OF CORRECTION

PATENT NO. : 10,126,469 B2
APPLICATION NO. : 15/485914
DATED : November 13, 2018
INVENTOR(S) : Ta-Hua Yu et al.

It is certified that error appears in the above-identified patent and that said Letters Patent is hereby corrected as shown below:

In the Specification

Column 4
Line 3, delete "triacylate" and insert -- triacrylate --, therefor.
Line 17, delete "perfluoroakoxy," and insert -- perfluoroalkoxy, --, therefor.

Column 5
Line 7, delete "anistropic" and insert -- anisotropic --, therefor.
Line 47, delete "Degusa" and insert -- Degussa --, therefor.

Column 6
Line 48, delete "nanopartilces." and insert -- nanoparticles. --, therefor.

Column 7
Line 30, delete "submicronmeter" and insert -- submicrometer --, therefor.
Line 33, delete "submicronmeter" and insert -- submicrometer --, therefor.
Line 35, delete "submicronmeter" and insert -- submicrometer --, therefor.
Line 36, delete "subsmicronmeter" and insert -- submicrometer --, therefor.
Line 40, delete "submicronmeter" and insert -- submicrometer --, therefor.

Column 9
Line 56, delete "Optionally." and insert -- Optionally, --, therefor.

Column 14
Lines 14-15, delete "for sizes in a range from for sizes in the range from" and insert -- for sizes in a range from --, therefor.
Line 37, delete "perfluoroakoxy," and insert -- perfluoroalkoxy, --, therefor.

Column 16
Line 66, delete "PerkinElmer. Walthan," and insert -- PerkinElmer, Waltham, --, therefor.

Signed and Sealed this
Twenty-ninth Day of January, 2019

Andrei Iancu
*Director of the United States Patent and Trademark Office*

Column 17
Line 57, delete "Trimethylolpropantriacrylate" and insert -- Trimethylolpropanetriacrylate --, therefor.

Columns 17-18
Line 67 [Column 17] 1 [Column 18], delete "trimethylolpropantriacrylate" and insert
-- trimethylolpropanetriacrylate --, therefor.

Column 18
Line 5 (approx.), delete "1-methoxoy" and insert -- 1-methoxy --, therefor.
Line 63, delete "trimethylolpropantriacrylate" and insert -- trimethylolpropanetriacrylate --, therefor.

In the Claims

Column 20
Lines 20-21, in Claim 3, delete "for sizes in a range from for sizes in the range from" and insert -- for sizes in a range from --, therefor.
Lines 43-44, in Claim 7, delete "for sizes in a range from for sizes in the range from" and insert -- for sizes in a range from --, therefor.